US010289798B1

(12) United States Patent
Nunes Barcelos et al.

(10) Patent No.: US 10,289,798 B1
(45) Date of Patent: May 14, 2019

(54) SYSTEM, METHOD, AND COMPUTER PROGRAM PRODUCT FOR PROPERTY CLUSTERING ASSOCIATED WITH FORMAL VERIFICATION OF AN ELECTRONIC CIRCUIT DESIGN

(71) Applicant: Cadence Design Systems, Inc., San Jose, CA (US)

(72) Inventors: Ronalu Augusta Nunes Barcelos, Belo Horizonte (BR); Hudson Dyele Pinheiro de Oliveira, Belo Horizonte (BR); Mirlaine Aparecida Crepalde, Belo Horizonte (BR); Lucas Luz Reckziegel, Porto Alegre (BR); Glauber Tadeu de Sousa Carmo, Belo Horizonte / Minas Gerais (BR); Augusto Amaral Mafra, Belo Horizonte (BR); Regina Mara Amaral Fonseca, Belo Horizonte (BR); Guilherme Henrique de Sousa Santos, Belo Horizonte / Minas Gerais (BR); Valdir Antoniazzi Júnior, Belo Horizonte (BR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/718,511

(22) Filed: Sep. 28, 2017

(51) Int. Cl.
*G06F 17/50* (2006.01)
*G06N 20/00* (2019.01)

(52) U.S. Cl.
CPC ......... *G06F 17/5081* (2013.01); *G06N 20/00* (2019.01)

(58) Field of Classification Search
CPC .................................................. G06F 17/5081
(Continued)

(56) References Cited

U.S. PATENT DOCUMENTS 6,581,191 B1 * 6/2003 Schubert ........ G01R 31/318357
703/14
7,243,322 B1 * 7/2007 Ly ....................... G06F 17/5022
716/108

(Continued)

OTHER PUBLICATIONS

El Mandouh, Eman et al., "Accelerating the Debugging of FV Traces Using K-Means Clustering Techniques," 2016 11th International Design & Test Symposium (IDT), IEEE, 6 pages (Dec. 18-20, 2016).

*Primary Examiner* — Suresh Memula
(74) *Attorney, Agent, or Firm* — Mark H. Whittenberger, Esq.; Holland & Knight LLP

(57) ABSTRACT

The present disclosure relates to a method for debugging associated with formal verification of an electronic design. Embodiments may include performing, using a processor, an initial formal verification of an electronic design. Embodiments may further include identifying one or more counter-examples associated with one or more assertion properties of the electronic design or identifying one or more cover-traces associated with one or more cover properties of the electronic design. Embodiments may further include generating a trace core for each of the one or more counter-examples or cover-traces, wherein each trace core includes a minimal representation of the counter-example or cover-trace. Embodiments may further include identifying a similarity between a plurality of the trace cores and clustering the plurality of trace cores having the similarity.

20 Claims, 8 Drawing Sheets

(58) Field of Classification Search
USPC .......................................................... 716/112
See application file for complete search history.

(56) References Cited

U.S. PATENT DOCUMENTS

| | | | | |
|---|---|---|---|---|
| 7,509,604 | B1* | 3/2009 | Koelbl | G06F 17/504 |
| | | | | 716/108 |
| 7,827,510 | B1* | 11/2010 | Schubert | G06F 17/5027 |
| | | | | 716/111 |
| 8,527,911 | B1* | 9/2013 | Kranen | G06F 17/5081 |
| | | | | 716/136 |
| 8,578,311 | B1* | 11/2013 | Baumgartner | G06F 17/5081 |
| | | | | 716/107 |
| 8,806,401 | B1* | 8/2014 | Sarwary | G06F 17/504 |
| | | | | 703/16 |
| 8,910,099 | B1* | 12/2014 | Goyal | G06F 17/504 |
| | | | | 716/112 |
| 2005/0268265 | A1* | 12/2005 | Ly | G06F 17/5022 |
| | | | | 716/108 |
| 2011/0093825 | A1* | 4/2011 | Baumgartner | G06F 17/504 |
| | | | | 716/108 |
| 2015/0278416 | A1* | 10/2015 | Darbari | G01R 31/31727 |
| | | | | 716/108 |
| 2015/0310154 | A1* | 10/2015 | Bobok | G06F 17/5045 |
| | | | | 716/106 |
| 2016/0012167 | A1* | 1/2016 | Jain | G06F 17/5045 |
| | | | | 716/107 |

* cited by examiner

| | Type | Name | Engine | Bound | Time | Task | Source |
|---|---|---|---|---|---|---|---|
| ✓ | Assert | counter_4_counter_1 | PRE | infinite | 0.0 | new_task | Analysis Session |
| ✗ | Assert | counter_3_in | N | 1 | 0.1 | <embedded> | Analysis Session |
| ✗ | Assert | counter_3_in | Hp | 1 | 0.0 | new_task | Analysis Session |
| ✗ | Assert | counter_3_in | N | 1 | 0.1 | <embedded> | Analysis Session |
| ✓ | Assert | counter_3_counter_1 | PRE | infinite | 0.0 | new_task | Analysis Session |
| ✓ | Assert | counter_2_in | PRE | infinite | 0.0 | <embedded> | Analysis Session |
| ✓ | Assert | counter_2_in | PRE | infinite | 0.0 | new_task | Analysis Session |
| ✓ | Assert | counter_2_counter_1 | PRE | infinite | 0.0 | <embedded> | Analysis Session |
| ✓ | Assert | counter_1_in | PRE | infinite | 0.0 | new_task | Analysis Session |
| ✓ | Assert | counter_1_in | PRE | infinite | 0.0 | <embedded> | Analysis Session |
| ✗ | Assert | counter_1_counter_1 | Hp | 3 | 0.0 | new_task | Analysis Session |
| ● | Assume | cont_1_constr | ? | | 0.0 | <embedded> | Analysis Session |

Total: 25    Filtered: 25    Selected: 0

SYSTEM, METHOD, AND COMPUTER PROGRAM PRODUCT FOR PROPERTY CLUSTERING ASSOCIATED WITH FORMAL VERIFICATION OF AN ELECTRONIC CIRCUIT DESIGN

FIELD OF THE INVENTION

The present disclosure relates to electronic design verification, and more specifically, to a method for debugging associated with formal verification.

DISCUSSION OF THE RELATED ART

Formal verification relies upon a system of constraints to communicate the legal state space to the proof engines. The situation often arises that there is one or more contradictions in the constraints that causes there to be no legal state space. The complexity of the system of constraints, in combination with the design and glue logic, makes it difficult, if not impossible, to precisely locate the root cause of the conflict.

While formal verification methods get more popular and the number of users increase, the ratio of users that comprehend the mechanics involved in model checking engines decreases. With more inexperienced users and more complex systems, it is common to see people stuck waiting for formal engines to give them a conclusive result without any clue of what is causing that engine to spend all that time and computational resources. Experienced users might understand the common sources of complexities for model checking engines and find them manually, however, when facing new and bigger designs they might be unable to determine what causes the engines to take more time.

SUMMARY OF DISCLOSURE

In one or more embodiments of the present disclosure, a computer-implemented method for debugging associated with formal verification of an electronic design is provided. The method may include performing, using a processor, an initial formal verification of an electronic design. The method may further include identifying one or more counter-examples associated with one or more assertion properties of the electronic design or identifying one or more cover-traces associated with one or more cover properties of the electronic design. The method may further include generating a trace core for each of the one or more counter-examples or cover-traces, wherein each trace core includes a minimal representation of the counter-example or cover-trace. The method may further include identifying a similarity between a plurality of the trace cores and clustering the plurality of trace cores having the similarity.

One or more of the following features may be included. In some embodiments, clustering may be based upon, at least in part, an unsupervised machine learning operation. Generating may be performed using a formal engine. Each trace core may further include one or more internal register values, one or more input values, and one or more undriven signals of the design under verification. The method may further include generating a trace core for at least one reached cover property. The method may also include displaying, at a graphical user interface, at least one property, based upon, at least in part, the clustering. The similarity may indicate a common root cause is associated with a plurality of the one or more counter-examples. The root cause may include a missing constraint. Displaying may include displaying one or more clustered assertion properties or one or more clustered cover properties.

In one or more embodiments of the present disclosure a computer-readable storage medium having stored thereon instructions, which when executed by a processor result in one or more operations is provided. Operations may include performing, using a processor, an initial formal verification of an electronic design. Operations may further include identifying one or more counter-examples associated with one or more assertion properties of the electronic design or identifying one or more cover-traces associated with one or more cover properties of the electronic design. Operations may further include generating a trace core for each of the one or more counter-examples or cover-traces, wherein each trace core includes a minimal representation of the counter-example or cover-trace. Operations may further include identifying a similarity between a plurality of the trace cores and clustering the plurality of trace cores having the similarity.

One or more of the following features may be included. In some embodiments, clustering may be based upon, at least in part, an unsupervised machine learning operation. Generating of a trace core may be performed using a formal engine. Each trace core may further include one or more internal register values, one or more input values, and one or more undriven signals of the design under verification. The method may further include generating a trace core for at least one reached cover property. The method may also include displaying, at a graphical user interface, at least one property, based upon, at least in part, the clustering. The similarity may indicate a common root cause is associated with a plurality of the one or more counter-examples. The root cause may include a missing constraint. Displaying may include displaying one or more clustered assertion properties or one or more clustered cover properties.

In one or more embodiments of the present disclosure, a system for debugging associated with formal verification of an electronic design is provided. The system may include a computing device having at least one processor configured to perform, using a processor, an initial formal verification of an electronic design. The at least one processor may be further configured to identify one or more counter-examples associated with one or more assertion properties of the electronic design or identifying one or more cover-traces associated with one or more cover properties of the electronic design. The at least one processor may be further configured to generate a trace core for each of the one or more counter-examples or cover-traces, wherein each trace core includes a minimal representation of the counter-example or cover-trace. The at least one processor may be configured to identify a similarity between a plurality of the trace cores and cluster the plurality of trace cores having the similarity.

One or more of the following features may be included. In some embodiments, each trace core may further include one or more internal register values, one or more input values, and one or more undriven signals of the design under verification.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 3 is a diagram depicting an embodiment in accordance with the present disclosure;

FIG. 4 is a diagram depicting an embodiment in accordance with the present disclosure;

FIG. 5 is a diagram depicting an embodiment in accordance with the present disclosure;

DETAILED DESCRIPTION

Figure 1:
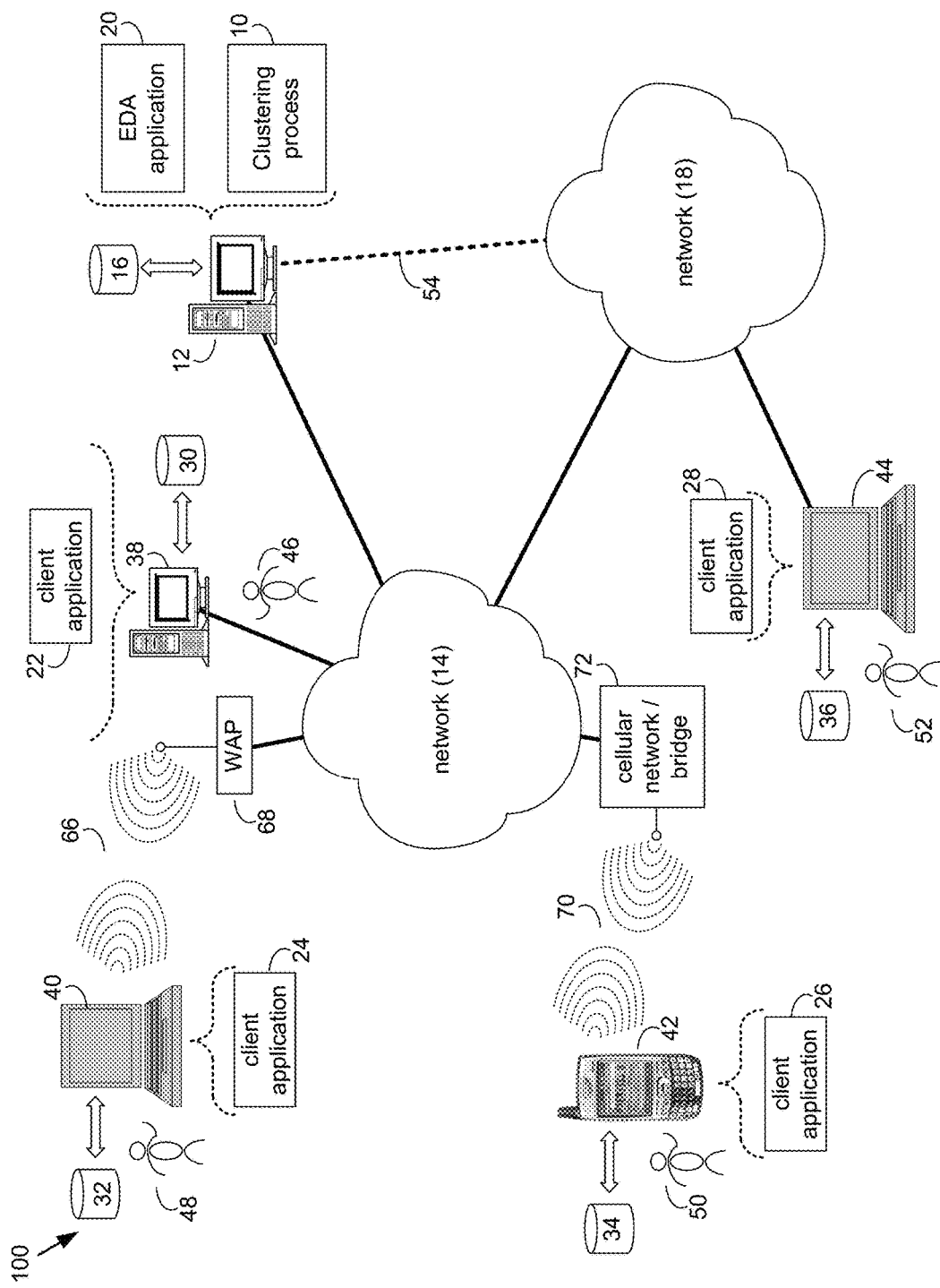
FIG. 1 is a diagram depicting an embodiment of a system in accordance with the present disclosure.

In formal verification tools, constraints are extremely important, as the lack of design constraints lead to spurious counter-examples. In existing systems, information about design constraints is missing or incomplete as it is usually based on the design specification, which may be unclear in many cases.

An initial verification setup that is imperfect might lead to a multiplicity of spurious counter-examples. The verification engineers might not know which counter-examples to investigate first, for example, these may be chosen at random or based on previous knowledge of the design. The debugging of those counter-examples will usually have to be done on a one by one basis, with a long turnaround time.

In contrast, embodiments of the clustering process described herein allow for the identification of the causes of those spurious counter-examples and subsequent grouping into a small set of properties. This may allow the tool to show the user the properties grouped themselves by the root causes of their violation.

Embodiments of clustering process 10 may allow for the formal tool to group properties by the similarities among the minimal representation of a counter-example of each property. As used herein, the minimal representation of a counter-example of a certain property may be referred to as a "trace core". Spurious counter-examples with similar trace cores are likely to have same root cause, for example, a missing constraint.

In some embodiments, machine learning approaches may be used to group those properties into meaningful clusters. It helps the verification engineers during the debugging of spurious counter-examples, as they will see properties in a more organized way, representative of the missing constraint that caused the specific violation of that cluster of properties.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a clustering process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, clustering process 10 may reside on and be executed, in whole or in part, by a client electronic device, such as a personal computer, notebook computer, personal digital assistant, or the like.

The instruction sets and subroutines of clustering process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization and/or verification.

Clustering process 10 may be a stand alone application, or may be an applet/application/script that may interact with and/or be executed within EDA application 20. In addition/ as an alternative to being a server-side process, clustering process 10 may be a client-side process (not shown) that may reside on a client electronic device (described below) and may interact with an EDA client application (e.g., one or more of EDA client applications 22, 24, 26, 28). Further, clustering process 10 may be a hybrid server-side/client-side process that may interact with EDA application 20 and an EDA client application (e.g., one or more of client applications 22, 24, 26, 28). As such, clustering process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize clustering process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
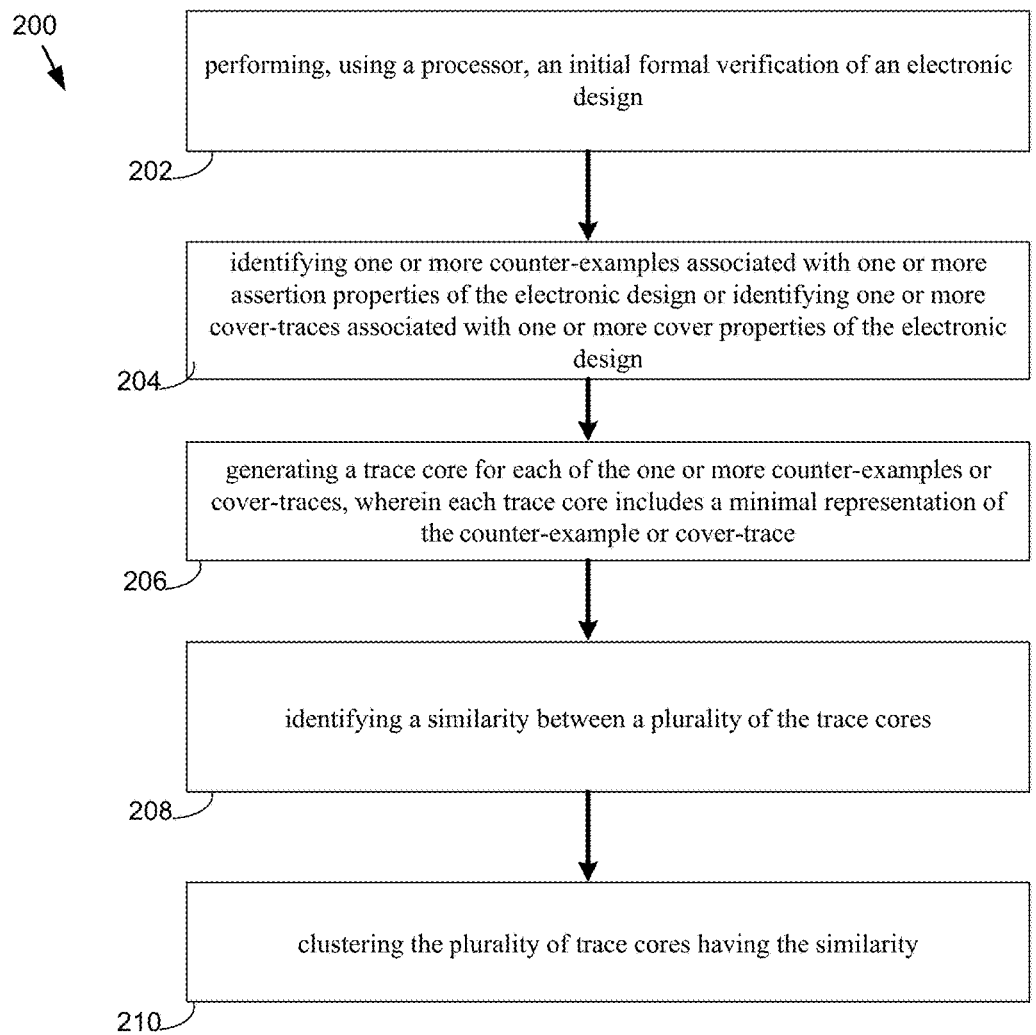
FIG. 2 is a flowchart depicting operations consistent with the clustering process in accordance with an embodiment of the present disclosure.

Referring now to FIG. 2, an exemplary flowchart 200 depicting operations consistent with clustering process 10 is provided. Operations may include performing (202), using a processor, an initial formal verification of an electronic design. The method may further include identifying (204) one or more counter-examples associated with one or more assertion properties of the electronic design or identifying one or more cover-traces associated with one or more cover properties of the electronic design. The method may further include generating (206) a trace core for each of the one or more counter-examples or cover-traces, wherein each trace core includes a minimal representation of the counter-example and cover-trace. The method may further include identifying (208) a similarity between a plurality of the trace cores and clustering (210) the plurality of trace cores having the similarity.

As discussed above, formal verification relies upon a system of constraints to communicate the legal state space to the proof engines. The situation often arises that there are one or more contradictions in the constraints that causes there to be no legal state space. The complexity of the system of constraints, in combination with the design and glue logic, makes it difficult, if not impossible, to precisely locate the root cause of the conflict.

As discussed above, while formal verification methods get more popular and the number of users increase, the ratio of users that comprehend the mechanics involved in model checking engines decreases. With more inexperienced users and more complex systems, it is common to see people stuck waiting for formal engines to give them a conclusive result without any clue of what is causing that engine to spend all that time and computational resources. Experienced users might know better some common sources of complexities for model checking engines and find them manually, but when facing new and bigger designs they might be unable to determine what causes the engines to take more time.

Figure 3:
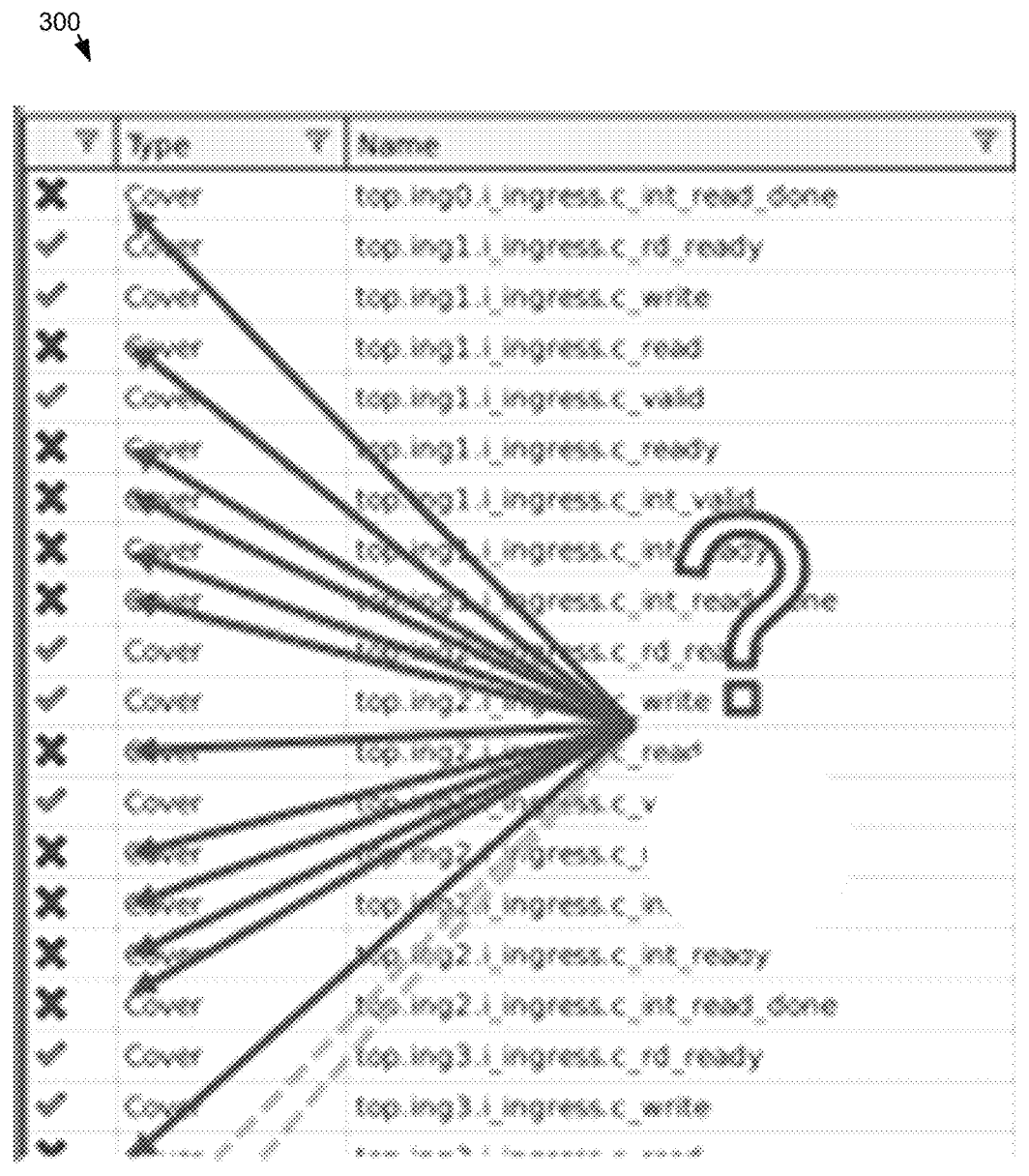

Referring also to FIG. 3, an example of a graphical user interface in accordance with previous solutions is provided. In this example, the proof of properties can take many hours and given a result, the user needs to select one property to debug at random. Generally, the debugging effort is directed towards locating a missing constraint, and the addition of a constraint might impact multiple counter-examples.

Figure 4:
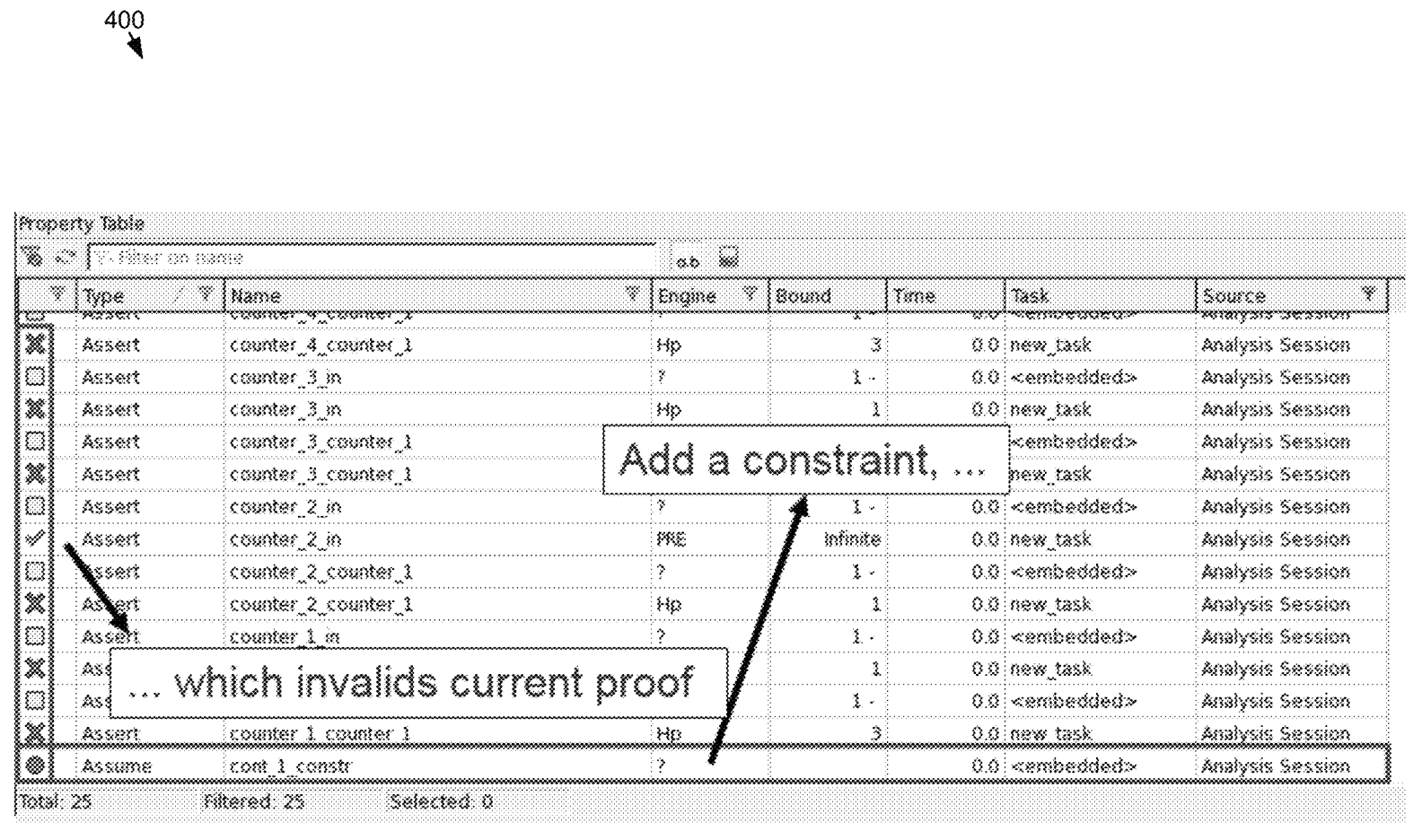

Referring also to FIG. 4, an example of the property table after the inclusion of a missing constraint is provided. The proof results are invalidated, therefore the properties must be proven again. The user should repeat this flow (e.g., prove, debug and add constraint) until the formal verification setup is correct. Similarly, in FIG. 5, the user needs to select one property to debug at random, prove the properties again and may have to continue to debug properties until a proper setup is achieved.

In some embodiments, formal verification may be initiated by feeding a formal tool with the design files described in a HDL language (e.g., Verilog, VHDL, etc.). In operation, an user may proceed to inform the formal tool about properties to be verified and constraints for the verification, some of which may include, but are not limited to, clock signals, reset signals, assumptions. Finally, the formal tool may initiate the analysis of the set of inputs to determine if properties can be violated or not. Users may also inform the formal tool of logic that can be discarded or remodeled for the analysis of the properties. This may be frequently used by experienced users to improve the performance of the formal engines. In existing systems, formal engines may take an unpredictable time to reach the result for the properties, which is a major source for frustration for users of formal tool.

In some embodiments, a formal engine profiler may be provided. The formal tool may receive a set of inputs from the user, and compile the logic into a format that a Boolean satisfiability ("SAT") checker, binary decision diagram ("BDD") checker, etc. may work with. As used herein the phrase "model checker" may deal with the reasoning at the level of temporal behavior. In other words, why the properties can't be violated in the first, second, third or even in any cycle. In doing this computation they can use a Boolean satisfiability ("SAT") checker or binary decision diagram ("BDD") package (e.g., a data structure and an algorithm).

Embodiments of clustering process 10 may be configured to group properties by trace core similarities once spurious counter-examples with similar trace cores are likely to have the same root cause. In some embodiments, a machine learning (e.g., clustering) approach may be used to group properties and guide debugging by property groups. Accordingly, addressing the root cause of a property is very likely to resolve all of the issues within its group and, as such, one action taken by the user may solve a group of problems. This way, less time is spent on debugging properties that may have been fixed by only one action and the user can debug multiple groups before attempting a new proof.

In some embodiments, clustering process 10 may utilize one or more formal engines as discussed above. For example, a formal engine may be configured to generate a trace core when a counter-example is found for a property and/or when a cover property is reached. This trace core may include the minimal representation of a counter-example for a certain property, initial values of registers, one or more values for relevant primary inputs of the design under verification, undriven signals of the design under verification, etc. The trace core has enough information to efficiently recreate a trace with the wanted characteristics, mostly satisfying constraints and violating a property or covering a cover. In some embodiments, trace cores may be generated for one or more reached cover properties.

Figure 6:
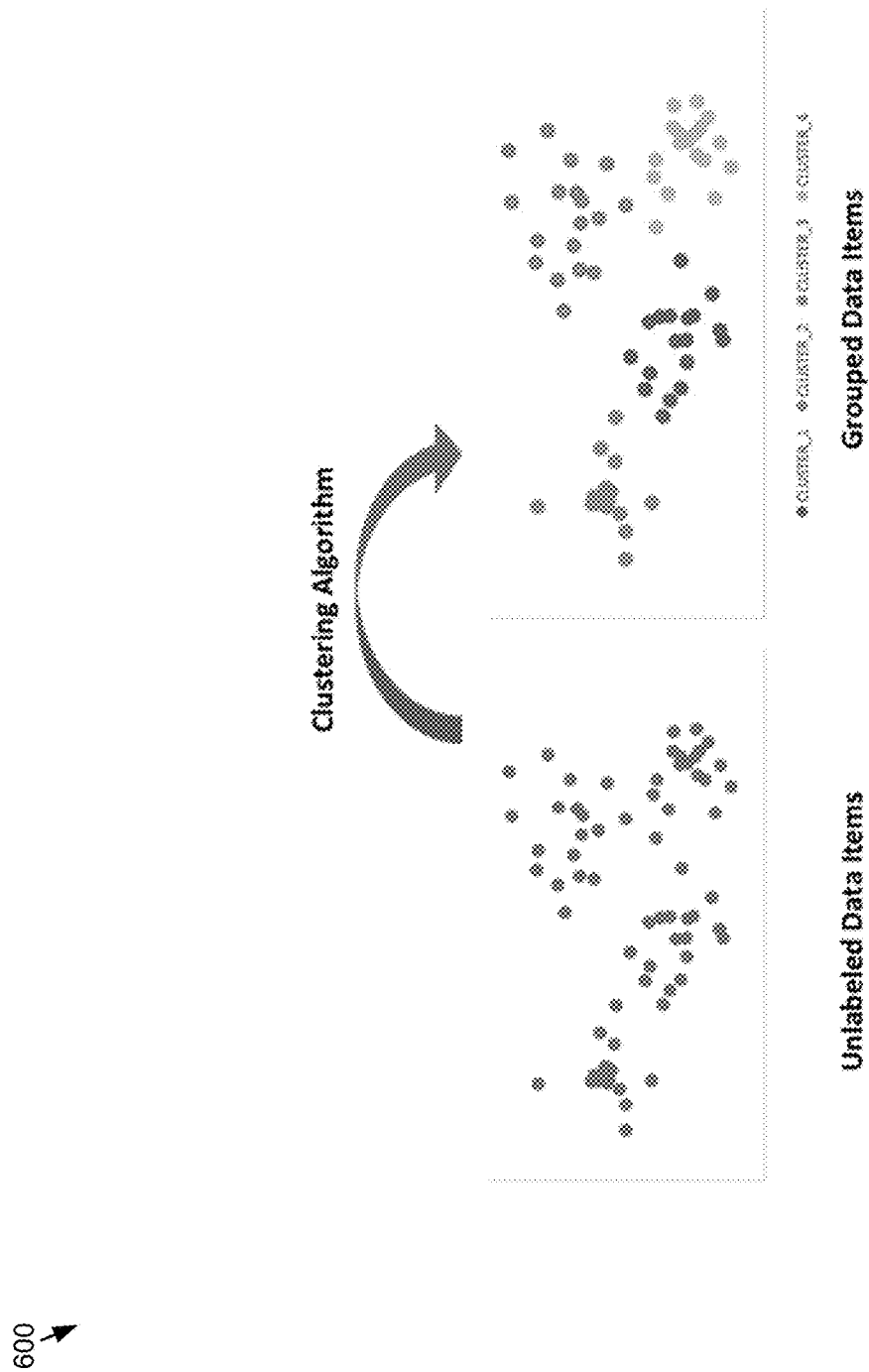
FIG. 6 is a diagram depicting an embodiment in accordance with the present disclosure.

In some embodiments, and referring also to FIG. 6, in order to be able to group properties and achieve described goals, clustering process 10 may employ machine learning clustering techniques. The term "clustering", as used herein, may refer to an unsupervised machine learning approach that groups a dataset automatically into subsets called clusters. The clustering approach is applied unto unlabeled data with the purpose of grouping them based on patterns and similarities in that data that had been hidden up to that point. In one or more embodiments, the grouping phase can be performed in one or more stages. In one or more embodiments, data items that have similiar structures and characteristics in their features will be grouped into meaningful clusters. Hence, unsupervised machine learning (and specifically, clustering) may be used to group assertion properties and/or cover properties into meaningful clusters by the similarities among the minimal representation of a counter-example of each assert property and/or by the minimal representation of the cover trace of each cover property. In one or more embodiments, the clustering approach may be applied unto unlabeled data—the features extracted from the trace cores of different assertion properties or cover properties, and group together the properties whose trace cores are similar. In one or more embodiments, the clustering approach may be applied unto features extracted from the trace core, and group together the properties whose counterexamples or cover traces were caused by the same root cause.

Figure 7:
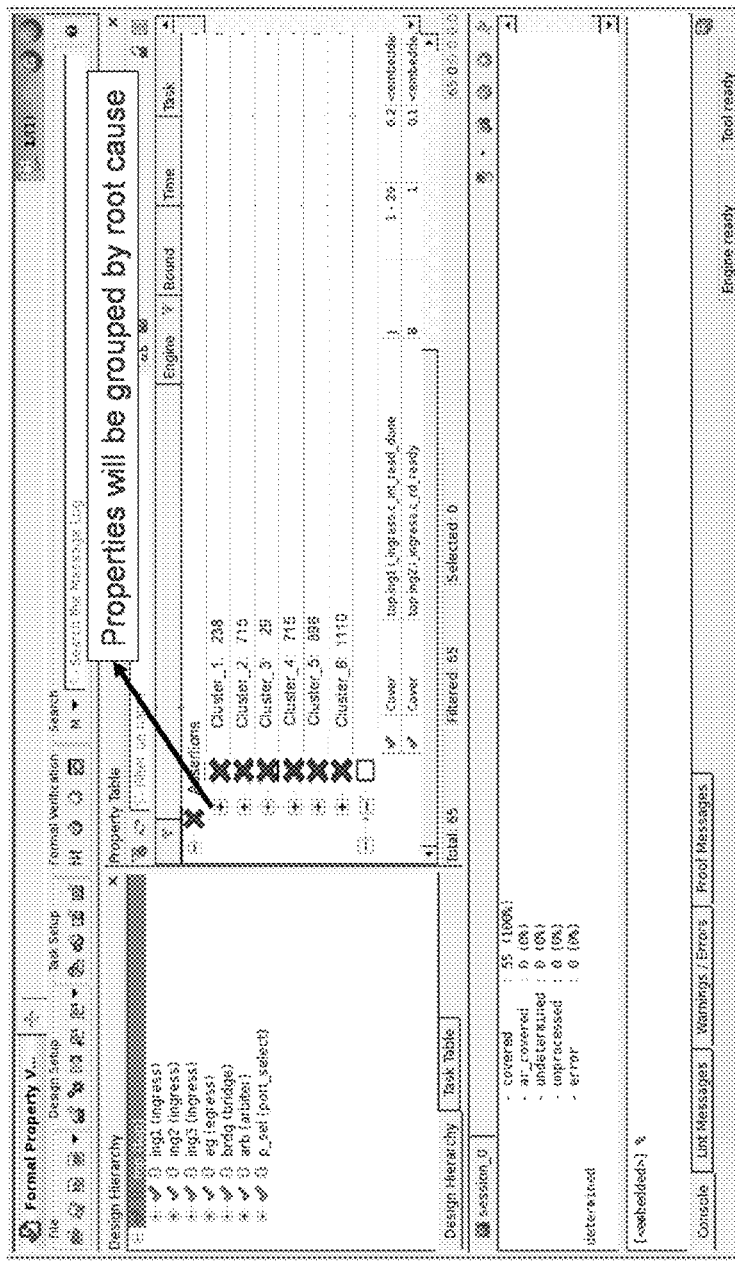
FIG. 7 is a diagram depicting an embodiment in accordance with the present disclosure.
Figure 8:
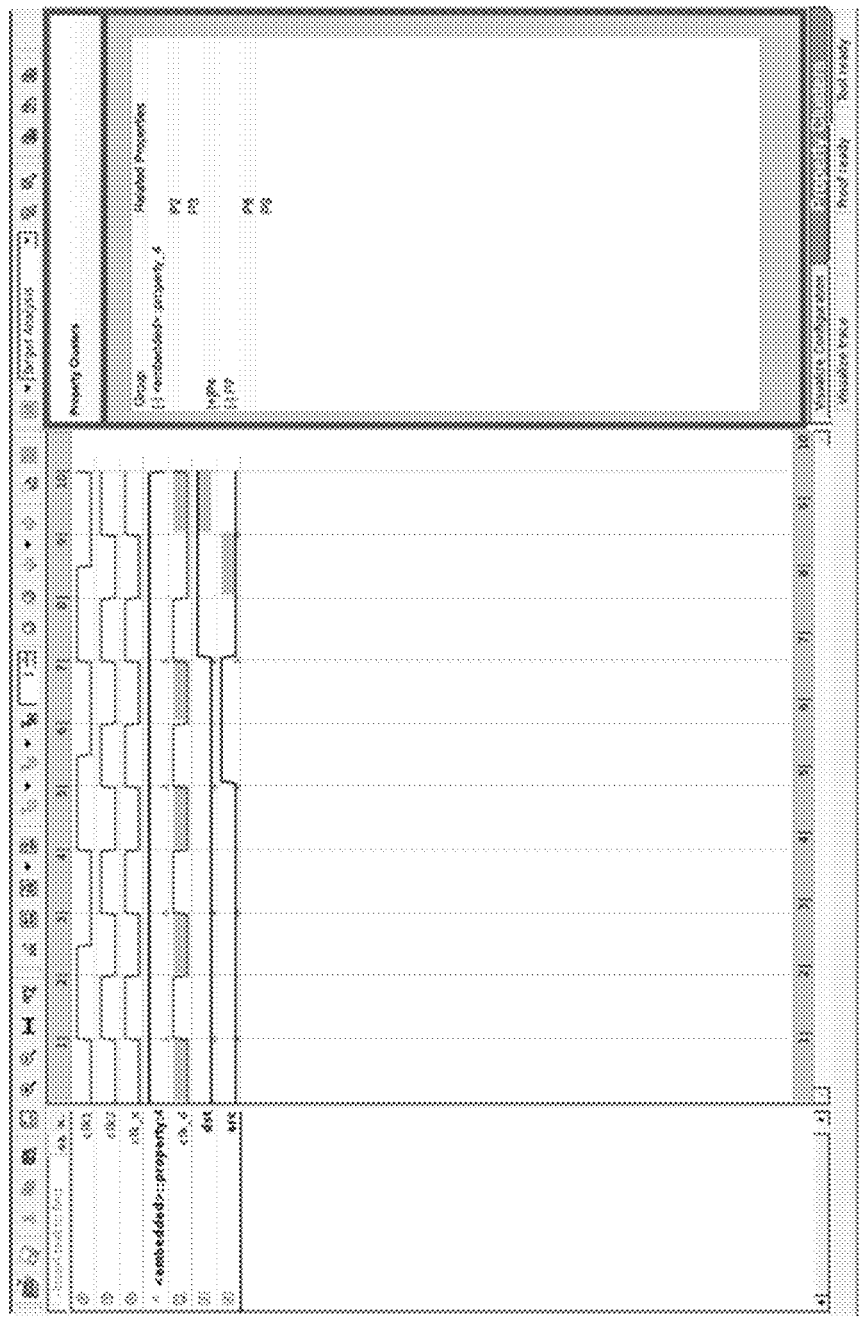
FIG. 8 is a diagram depicting an embodiment in accordance with the present disclosure.

Referring also to FIGS. 7-8, embodiments consistent with clustering process 10 are provided. These figures depict examples of graphical user interfaces that may be used in accordance with clustering process 10. Accordingly, and as described above, clustering process 10 may be configured to identify one or more properties that should be debugged first. In this way, clustering process 10 may be configured to group properties by trace core similarities. As described above, spurious counter-examples with similar trace cores are likely to have same root cause. Machine learning (clustering) can be used to group properties and debugging may be guided using any suitable approach, including, but not limited to, by using property groups. In some examples, addressing the root cause of a property is very likely to resolve all issues within its group. Accordingly, one action taken by the user may solve a group of problems.

In some embodiments, a formal tool graphical user interface may provide a table where all properties, both assertions and covers, are listed. FIG. 7 displays one possible way of presenting clusters of properties in this property table, which is in a tree view form. This property grouping represents a visual aid to the verification engineer or RTL designer so as to reduce debugging time, as the tool may have already grouped properties with a similar root cause, as opposed to a property table in which no grouping is presented, and the user will likely have to inspect counter-examples manually, one by one.

In some embodiments, for each tree depicted in the property table representing one cluster of properties, the root of the tree may be any data that is feasible to help the user in debugging the given cluster. Examples may include, but are not limited to, one property within the cluster, the property which is indicated as the center of the cluster by the clustering algorithm, one or more design signals that are relevant to any of the grouped properties, etc. From each one of these properties, the user may open the waveform viewer, displaying a trace for the given counter-example, as depicted in FIG. 8.

Embodiments included herein may be integrated to the waveform viewer in a variety of ways. Some of these may include, but are not limited to, a property clusters tab indicating the property cluster related to the current counter-example being displayed, the multitude of clusters, possibly displaying a measure of the distance between these clusters, etc. In operation, the user may then easily compare the counter-examples of two or more properties on the same cluster and come to a conclusion towards missing constraint in a faster way. Embodiments of clustering process 10 may also be configured to provide a graphical feature showing the difference between plotted waveforms for properties within the same cluster or among properties from different clusters In some embodiments, the causes of the spurious counter-examples of properties may be grouped into a small set of missing constraints. As such, clustering process 10 may enable the grouping of properties according the similarities of trace cores, that suggest a same set of missing constraints that led to its counter-example, using an unsupervised machine learning technique (e.g., clustering). The assert properties and cover properties that were grouped in different clusters may be shown in a graphical user interface in meaningful groups, for example, based on root cause as described in the minimal representation of the property violation. In some embodiments, aspects of the results of clustering process 10 may be displayed in a new tab in which other properties that belong to the same cluster of the property being visualized would be displayed. In this way, the user could then easily compare the counter-examples of two or more properties on the same cluster and come to a conclusion towards missing constraint in a faster way.

The term "trace core", as used herein, may refer to a sequence of values for all signals that are relevant to the trace. Relevant signals may include, but are not limited to, design inputs, registers and undriven signals of the design under verification that are relevant to the trace target. In some embodiments, a trace core may be represented, but is not limited to, on a textual format where each line may include one of those signals, followed by the values described in the binary base that the signal is set to in each cycle of the trace. A trace core may have values for specific categories of signals of the design under verification—primary inputs, undriven signals, flops and latches, within the cone of influence of the property/target.

When the formal engines find a counter-example for a given property, they extract the relevant values for achieving the trace for each of the relevant signals. This information may be placed in a textual format to a file, in which each line corresponds to the name of inputs, flops, latches, and undriven signals of the design under verification, and each column represents the value achieved by each of these elements in the different clock cycles.

In some embodiments, similarities may not be extracted directly from the trace core information. The clustering machine learning approaches described herein may involve a pre-processing of the data (in this example each trace core for each of the counter-examples) to extract features that characterize the counter-example. These approaches may operate on top of these features to cluster them.

In some embodiments, features may be obtained by mathematical transformations on the data available on the trace core. Examples of features may include, but are not limited to, a list of signals in the trace core file, a list of signals combined with the value for the first cycle of the trace core, the number of value changes for each signal, calculation on top of all the values for each signal, etc.

An example of a trace core file is provided below
direction[0] 0 0 0 0 0 1 0 1 1 0 0 1 1 1 1 1 0 1 1 0 1 1 0 1
direction[1] 0 1 0 1 1 1 0 0 1 0 0 1 0 1 1 0 1 0 0 0 0 1 1 0
direction[2] 1 1 1 0 1 0 0 1 0 0 0 1 1 0 1 1 0 0 0 1 0 1 1 1
start_position[0] 0 0 0 0 0 0 0 0 0 0 0 0 0 0 0 0 0 0 0 0 0 0 0 0
start_position[1] 0 0 0 0 0 0 0 0 0 0 0 0 0 0 0 0 0 0 0 0 0 0 0 0
start_position[2] 1 1 1 1 1 1 1 1 1 1 1 1 1 1 1 1 1 1 1 1 1 1 1 1
start_position[3] 0 0 0 0 0 0 0 0 0 0 0 0 0 0 0 0 0 0 0 0 0 0 0 0
start_position[4] 0 0 0 0 0 0 0 0 0 0 0 0 0 0 0 0 0 0 0 0 0 0 0 0
start_position[5] 1 0 0 0 0 0 0 0 0 0 0 0 0 0 0 0 0 0 0 0 0 0 0 0
start_position[6] 0 0 0 0 0 0 0 0 0 0 0 0 0 0 0 0 0 0 0 0 0 0 0 0
start_position[7] 0 0 0 0 0 0 0 0 0 0 0 0 0 0 0 0 0 0 0 0 0 0 0 0
start_position[8] 0 1 1 1 1 1 1 1 1 1 1 1 1 1 1 1 1 1 1 1 1 1 1 1
start_position[9] 0 0 0 0 0 0 0 0 0 0 0 0 0 0 0 0 0 0 0 0 0 0 0 0
visited_board[0][0] x x x x x x x x x x x x x x x x x x x x x x x x
visited_board[0][1] x x x x x x x x x x x x x x x x x x x x x x x x
visited_board[0][2] x x x x x x x x x x x x x x x x x x x x x x x x
visited_board[0][3] x x x x x x x x x x x x x x x x x x x x x x x x
visited_board[0][4] x 1 1 1 1 1 1 1 1 1 1 1 1 1 1 1 1 1 1 1 1 1 1 1
:pr_295[0] x x x x x x x x x x x x x x x x x x x x x x x x
:pr_295[1] x x x x x x x x x x x x x x x x x x x x x x x x
:pr_295[2] x x x x x x x x x x x x x x x x x x x x x x x x
:pr_295[3] x x x x x x x x x x x x x x x x x x x x x x x x
:pr_295[4] x x x x x x x x x x x x x x x x x x x x x x x x
:pr_295[5] x x x x x x x x x x x x x x x x x x x x x x x x
:pr_295[6] x x x x x x x x x x x x x x x x x x x x x x x x
:pr_295[7] x x x x x x x x x x x x x x x x x x x x x x x x
:pr_295[8] x x x x x x x x x x x x x x x x x x x x x x x x
:pr_295[9] x x x x x x x x x x x x x x x x x x x x x x x x
:pr_295[10] x x x x x x x x x x x x x x x x x x x x x x x x
:pr_295[11] x x x x x x x x x x x x x x x x x x x x x x x x
:pr_295[12] x x x x x x x x x x x x x x x x x x x x x x x x
:pr_295[13] x x x x x x x x x x x x x x x x x x x x x x x x
:pr_295[14] x x x x x x x x x x x x x x x x x x x x x x x x
:pr_295[15] x x x x x x x x x x x x x x x x x x x x x x x x
:pr_295[16] x x x x x x x x x x x x x x x x x x x x x x x x
:pr_295[17] x x x x x x x x x x x x x x x x x x x x x x x x
:pr_295[18] x x x x x x x x x x x x x x x x x x x x x x x x
:pr_295[19] x x x x x x x x x x x x x x x x x x x x x x x x
:pr_295[20] x x x x x x x x x x x x x x x x x x x x x x x x
:pr_295[21] x x x x x x x x x x x x x x x x x x x x x x x x
:pr_295[22] x x x x x x x x x x x x x x x x x x x x x x x x
:pr_295[23] x x x x x x x x x x x x x x x x x x x x x x x x
:pr_295[24] x 1 1 1 1 1 1 1 1 1 1 1 1 1 1 1 1 1 1 1 1 1 1 1
Sampling Information
:global_clock 1 1 1 1 1 1 1 1 1 1 1 1 1 1 1 1 1 1 1 1 1 1 1 1
clk 1 1 1 1 1 1 1 1 1 1 1 1 1 1 1 1 1 1 1 1 1 1 1 1
:expr_42.:open_tmp_expr_2 1 1 1 1 1 1 1 1 1 1 1 1 1 1 1 1 1 1 1 1 1 1 1 1
:expr_47.:open_tmp_expr_2 1 1 1 1 1 1 1 1 1 1 1 1 1 1 1 1 1 1 1 1 1 1 1 1
:expr_38.:open_tmp_expr_1 1 1 1 1 1 1 1 1 1 1 1 1 1 1 1 1 1 1 1 1 1 1 1 1
:expr_43.:open_tmp_expr_2 1 1 1 1 1 1 1 1 1 1 1 1 1 1 1 1 1 1 1 1 1 1 1 1
:expr_48.:open_tmp_expr_2 1 1 1 1 1 1 1 1 1 1 1 1 1 1 1 1 1 1 1 1 1 1 1 1
:expr_44.:open_tmp_expr_2 1 1 1 1 1 1 1 1 1 1 1 1 1 1 1 1 1 1 1 1 1 1 1 1

:expr_49.:open_tmp_expr_2 1 1 1 1 1 1 1 1 1 1 1 1 1 1 1 1 1 1 1 1 1 1 1 1
:expr_37.:open_tmp_expr_1 1 1 1 1 1 1 1 1 1 1 1 1 1 1 1 1 1 1 1 1 1 1 1 1
:expr_45.:open_tmp_expr_2 1 1 1 1 1 1 1 1 1 1 1 1 1 1 1 1 1 1 1 1 1 1 1 1
:expr_46.:open_tmp_expr_2 1 1 1 1 1 1 1 1 1 1 1 1 1 1 1 1 1 1 1 1 1 1 1 1

Embodiments of clustering process 10 may provide a number advantages over previous approaches. Using the teachings of the present disclosure a user may spend less time debugging properties that may have been fixed by an action and the user can debug multiple groups before attempting a new proof. Embodiments included herein may improve debugging productivity, reduce human effort on waveform inspection, allow the tool to find and group properties with same root causes, optimize time spent on interactive debugging, facilitate finding set of missing constraints, enable correct proof setup (e.g., less spurious counter-examples), allows for improved visualization and prioritization as it is easier to identify property dependencies and prioritize the most important ones, and improves time management (e.g., easier to determine number of issues to be fixed, assists engineers in estimating debug efforts more precisely, etc.).

Existing approaches display property counter-examples without any context or grouping (except for automatic lint properties, which is based on source location). Without this grouping, user has no guidance for debugging. For example, the lint property tool performs grouping (clubbing) on properties that have the same type, same proof status and same source location, but from different instances, showing one while enabling the user to see related ones.

Accordingly, using clustering process 10, the debugging of properties is no longer at random, but guided by the clusters based on root cause as described in the minimal representation of property violation. This is in stark contrast to linting techniques, which are based on RTL source location, our invention is based on trace core, which relates to the root cause of the violation.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for debugging associated with formal verification of an electronic design comprising:
    performing, using a processor, an initial formal verification of an electronic design;
    identifying one or more counter-examples associated with one or more assertion properties of the electronic design or identifying one or more cover-traces associated with one or more cover properties of the electronic design;
    generating a trace core for each of the one or more counter-examples or cover-traces, wherein each trace core includes a minimal representation of the counter-example or cover-trace;
    identifying a similarity between a plurality of the trace cores; and
    clustering the plurality of trace cores having the similarity.

2. The computer-implemented method of claim 1, wherein clustering is based upon, at least in part, an unsupervised machine learning operation.

3. The computer-implemented method of claim 1, wherein generating is performed using a formal engine.

4. The computer-implemented method of claim 1, wherein each trace core further includes one or more internal register values, one or more input values, and one or more undriven signals of the design under verification.

5. The computer-implemented method of claim 1, further comprising:
    generating a trace core for at least one reached cover property.

6. The computer-implemented method of claim 1, further comprising:
    displaying, at a graphical user interface, at least one property, based upon, at least in part, the clustering.

7. The computer-implemented method of claim 1, wherein the similarity indicates a common root cause is associated with a plurality of the one or more counter-examples.

8. The computer-implemented method of claim 7, wherein the root cause includes a missing constraint.

9. The computer-implemented method of claim 6, wherein displaying includes displaying one or more clustered assertion properties or one or more clustered cover properties.

10. A non-transitory computer-readable storage medium for debugging in electronic design verification, the computer-readable storage medium having stored thereon instructions that when executed by a machine result in one or more operations, the operations comprising:
    performing, using a processor, an initial formal verification of an electronic design;
    identifying one or more counter-examples associated with one or more assertion properties of the electronic design or identifying one or more cover-traces associated with one or more cover properties of the electronic design;
    generating a trace core for each of the one or more counter-examples or cover-traces, wherein each trace core includes a minimal representation of the counter-example or cover-trace;
    identifying a similarity between a plurality of the trace cores; and
    clustering the plurality of trace cores having the similarity.

11. The non-transitory computer-readable storage medium of claim 10, wherein clustering is based upon, at least in part, an unsupervised machine learning operation.

12. The non-transitory computer-readable storage medium of claim 10, wherein generating is performed using a formal engine.

13. The non-transitory computer-readable storage medium of claim 10, wherein each trace core further includes one or more internal register values, one or more input values, and one or more undriven signals of the design under verification.

14. The non-transitory computer-readable storage medium of claim 10, further comprising:
    generating a trace core for at least one reached cover property.

15. The non-transitory computer-readable storage medium of claim 10, further comprising:
    displaying, at a graphical user interface, at least one property, based upon, at least in part, the clustering.

16. The non-transitory computer-readable storage medium of claim 10, wherein the similarity indicates a common root cause is associated with a plurality of the one or more counter-examples.

17. The non-transitory computer-readable storage medium of claim 16, wherein the root cause includes a missing constraint.

18. The non-transitory computer-readable storage medium of claim 15, wherein displaying includes displaying one or more clustered assertion properties or one or more clustered cover properties.

19. A system for debugging associated with formal verification of an electronic design comprising:
  a computing device having at least one processor configured to perform, using a processor, an initial formal verification of an electronic design, the at least one processor further configured to identify one or more counter-examples associated with one or more assertion properties of the electronic design or identifying one or more cover-traces associated with one or more cover properties of the electronic design, the at least one processor further configured to generate a trace core for each of the one or more counter-examples or cover-traces, wherein each trace core includes a minimal representation of the counter-example or cover-trace, the at least one processor configured to identify a similarity between a plurality of the trace cores and cluster the plurality of trace cores having the similarity.

20. The system of claim 19, wherein each trace core further includes one or more internal register values, one or more input values, and one or more undriven signals of the design under verification.

* * * * *